(12) United States Patent
Tani

(10) Patent No.: US 6,204,788 B1
(45) Date of Patent: Mar. 20, 2001

(54) DIGITAL/ANALOG CONVERSION APPARATUS

(75) Inventor: Yasunori Tani, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/370,884

(22) Filed: Aug. 10, 1999

(30) Foreign Application Priority Data

Aug. 25, 1998 (JP) ................................................. 10-239000

(51) Int. Cl.[7] ....................................................... H03M 3/00
(52) U.S. Cl. ................................................................ 341/144
(58) Field of Search ..................................... 341/144, 143, 341/77, 61, 76

(56) References Cited

U.S. PATENT DOCUMENTS

| | | |
|---|---|---|
| 5,068,661 | 11/1991 | Keneaki et al. . |
| 5,539,403 | 7/1996 | Tani et al. . |
| 5,621,407 | 4/1997 | Jeong et al. . |
| 5,661,479 * | 8/1997 | Tang ........................................ 341/76 |
| 5,682,162 * | 10/1997 | Hamasaki et al. .................... 341/144 |

FOREIGN PATENT DOCUMENTS

| | | |
|---|---|---|
| 5-335963 | 12/1993 | (JP) . |
| 9-167966 | 6/1997 | (JP) . |

* cited by examiner

Primary Examiner—Brian Young
(74) Attorney, Agent, or Firm—Stevens, Davis, Miller & Mosher, L.L.P.

(57) ABSTRACT

A digital/analog conversion apparatus not causing harmonic distortion at the outputs of a row of 1-bit digital/analog converters and capable of effectively suppressing occurrence of harmonic distortion because of variations among the outputs of the 1-bit digital/analog converters, being configured as described below. More specifically, first, a digital input is converted into a digital signal having p values at a sampling frequency raised by a digital filter and a noise shaper. A decoder assigns the output of the noise shaper to a row of (p−1) 1-bit signals so that the position of value "1" is circulated, and designates the position of an inhibit bit in the row of 1-bit signals. When the assignment of value "1" is circulated to the inhibit bit position, the assignment advances to avoid the inhibit bit, and the position of the inhibit bit is moved so as to be circulated to the next bit. The row of 1-bit signals is then converted into analog signals by a row of (p−1) uniform 1-bit digital/analog converters, and the analog signals are integrated by an analog adder.

17 Claims, 8 Drawing Sheets

DIGITAL/ANALOG CONVERSION APPARATUS

BACKGROUND OF THE INVENTION

1. Field of the Invention

The present invention relates to a digital/analog conversion apparatus for converting a digital signal into an analog signal. More particularly, it relates to an oversampling-type digital/analog conversion apparatus for carrying out digital/analog conversion at a sampling frequency higher than the sampling frequency of a digital input signal.

2. Description of the Related Art

A digital/analog conversion apparatus comprising a noise shaper and a row of 1-bit digital/analog converters is known as a digital/analog conversion apparatus. This conventionally known type of digital/analog conversion apparatus will be described below referring to FIG. 6. This technology is disclosed in Japanese Laid-open Patent Application No. Hei 5-335963.

FIG. 6 is a block diagram showing an example of a conventional digital/analog conversion apparatus. Referring to FIG. 6, a digital filter 10 is used to increase the sampling frequency fs of an input digital signal, for example, a digital audio signal reproduced from a compact disc, by k times (k: an integer). For the purpose of the explanations given hereinafter, it is assumed that fs=44.1 kHz, and that k=64.

A noise shaper 11 is used to carry out quantization (word length limitation) for a digital signal output from the digital filter 10 and to change the frequency characteristic of noise to a predetermined characteristic. More specifically, the frequency characteristic of noise is changed so that the noise level in the low-frequency region is lowered and so that the noise level in the high-frequency region is raised, for example. It is herein assumed that the noise shaper 11 has a tertiary characteristic, and that output Y relative to input X is represented by (Equation 1).

The quantization (word length limitation) of the digital signal will be described below. The word length limitation is to change such a 16-bit signal as used for a CD player to a signal having about four bits. In other words, briefly speaking, only the higher-order 4 bits of the 16-bit signal are output, and the lower-order 12 bits are fed back and added to the next signal input, whereby the information for the 12 bits to be truncated is made alive. This process is referred to as "noise shaping".

$$Y = X + (1-z^{-1})^3 \cdot Vq \quad \text{(Equation 1)}$$

where

Vq: a quantization error
$z^{-1} = \cos\theta - j \cdot \sin\theta$
j: an imaginary unit Furthermore, it is herein assumed that the output Y has seven (=p) output levels (−3 to +3). In addition, to simplify explanations, 3 is added to the output levels, and the output levels in the range of 0 to 6 are used in the following explanations.

A pointer 60 is used to output the remainder of the accumulated value of its input signal. It is herein assumed that the output of the noise shaper 11 is accumulated, and the remainder of the accumulated value, with 6 used as the modulus, is output. When the input of the pointer 60 at time n is assumed to be Xn, the output Yn is represented by (Equation 2).

$$Yn = (Xn-1 + Yn-1) \mod 6 \quad \text{(Equation 1)}$$

where

Xn−1: the input at the immediately preceding sample
Yn−1: the output at the immediately preceding sample A read-only memory (ROM) 61 uses an input signal as an address and outputs 6 (=m=p −1) bit data D5 to D0 corresponding to the address. TABLE 1 shows the relationship between the address of the read-only memory 61 and the data. In TABLE 1, "0" is represented by "." for ease of reading.

TABLE 1

| Address | Data | | | | | |
| | D5 | D4 | D3 | D2 | D1 | D0 |
|---|---|---|---|---|---|---|
| 0 | . | . | . | . | . | . |
| 1 | . | . | . | . | . | 1 |
| 2 | . | . | . | . | 1 | 1 |
| 3 | . | . | . | 1 | 1 | 1 |
| 4 | . | . | 1 | 1 | 1 | 1 |
| 5 | . | 1 | 1 | 1 | 1 | 1 |
| 6 | 1 | 1 | 1 | 1 | 1 | 1 |

As shown in TABLE 1, the read-only memory 61 replaces an input signal with 1-bit signals, the number of which corresponds to the value of the input signal. More specifically, in the case when the of the input signal is 2 for example, two 1-bit signals among six 1-bit signals take on value "1", and the other 1-bit signals take on value "0". When the value of the input signal takes on a value other than the above-mentioned value, 1-bit signals, the number of which is the value shown in TABLE 1, take on value "1" and the other 1-bit signals take on value "0".

A shifter 62 is used to cyclically shift the 6-bit output of the read-only memory 61 in accordance with the output of the pointer 60. TABLE 2 shows the relationship between the output data D5 to D0 of the read-only memory 61 and the output data b5 to b0 of the shifter 62 in accordance with the output of the pointer 60.

TABLE 2

| Pointer | Output data | | | | | |
| | b5 | b4 | b3 | b2 | b1 | b0 |
|---|---|---|---|---|---|---|
| 0 | D5 | D4 | D3 | D2 | D1 | D0 |
| 1 | D4 | D3 | D2 | D1 | D0 | D5 |
| 2 | D3 | D2 | D1 | D0 | D5 | D4 |
| 3 | D2 | D1 | D0 | D5 | D4 | D3 |
| 4 | D1 | D0 | D5 | D4 | D3 | D2 |
| 5 | D0 | D5 | D4 | D3 | D2 | D1 |

A row of 1-bit digital/analog converters 13 comprises 6 (=m) 1-bit digital/analog converters 13-1 to 13-6, each having a uniform characteristic for example, and converts the outputs of the shifter 62 into analog signals.

An analog adder 14 integrates (adds) 6 analog signals output from the row of 1-bit digital/analog converters 13, and outputs the result as an analog signal.

A digital/analog conversion circuit 15 comprises the row of 1-bit digital/analog converters 13 and the analog adder 14.

In the digital/analog conversion apparatus shown in FIG. 6, a digital input signal is changed to a signal having a sampling frequency of 64 fs and seven (=p) levels by the digital filter 10 and the noise shaper 11, and then changed to a row of 1-bit signals comprising six 1-bit signals by the pointer 60, the read-only memory 61 and the shifter 62, and further converted into an analog signal by the digital/analog conversion circuit 15. This digital/analog conversion apparatus is the so-called oversampling-type digital/analog conversion apparatus for converting a digital signal into an analog signal by using a sampling frequency higher than the frequency of the digital signal.

FIG. 7 shows the results of a computer simulation of the output signal spectrum of the digital/analog conversion apparatus shown in FIG. 6 in the case when the digital/analog conversion circuit 15 has an ideal characteristic. As an input signal, a digital signal equivalent to a sinusoidal wave of 2 kHz and 0 dB is supplied. In addition, a signal in the range of 0 to 2 fs (88.2 kHz) is shown. The above-mentioned ideal characteristic is that all the six 1-bit digital/analog converters 13-1 to 13-6 of the row of 1-bit digital/analog converters 13 have a uniform output.

In this digital/analog conversion apparatus, a digital signal having only seven levels is converted into an analog signal as described above. However, by using the noise shaper 11, it is possible to obtain a dynamic range of more than 100 dB in the signal frequency band of 0 to fs/2 as shown in FIG. 7.

Next, the operations of the pointer 60, the read-only memory 61 and the shifter 62 will be described below.

In FIG. 7, an ideal case is assumed, wherein all the six 1-bit digital/analog converters 13-1 to 13-6 of the row of 1-bit digital/analog converters 13 have a uniform output. However, since it is impossible to produce the 1-bit digital/analog converters 13-1 to 13-6 completely uniformly in an actual circuit, some variations (relative errors) are present inevitably among the outputs of the 1-bit digital/analog converters 13-1 to 13-6. The variations will cause noise and harmonic distortion. To prevent the noise and harmonic distortion, the 1-bit digital/analog converters 13-1 to 13-6 are cyclically used in the digital/analog conversion apparatus.

The reasons why the noise and harmonic distortion are caused by the variations in the characteristics of the 1-bit digital/analog converters 13-1 to 13-6, and the reasons why the harmonic distortion is suppressed by cyclically using the 1-bit digital/analog converters 13-1 to 13-6 will be described below.

Seven outputs in the range of 0 to +7 can be obtained by using the six 1-bit digital/analog converters 13-1 to 13-6. However, if the output level of the third 1-bit digital/analog converter 13-3 is not +1 but +1.01 for example, +3.01 is output, although +3 should be output essentially, thereby causing an error. In other words, distortion occurs. If the input signal is not a pure tone, the output becomes noisy.

By cyclically using the six 1-bit digital/analog converters 13-1 to 13-6, the 1-bit digital/analog converters 13-1 to 13-6 can be used almost uniformly in a long period of time. As a result, the distortion due to the error components is dispersed, whereby the harmonic distortion is suppressed as the result of the addition of the signals of the 1-bit digital/analog converters 13-1 to 13-6.

A configuration for cyclically using the 1-bit digital/analog converters 13-1 to 13-6 will be described below. In the digital/analog conversion apparatus, a signal having seven levels (0 to 6) output from the noise shaper 11 is first input to the pointer 60. As a result, the pointer 60 accumulates the signal having seven levels (0 to 6) output from the noise shaper 11, and obtains and outputs the remainder of the accumulated value, with 6 used as the modulus, as described above. Therefore, the output of the pointer 60 has six values in the range of 0 to 5.

On the other hand, by also inputting the output of the noise shaper 11 to the read-only memory 61, 6-bit data is obtained from the read-only memory 6. This 6-bit data represents unweighted six 1-bit signals. Furthermore, by inputting these six 1-bit signals to the shifter 62, and by inputting the output of the pointer 60 to the shifter 62, the six 1-bit signals are circulated. The outputs of the shifter 62 obtained as described above are as shown in TABLE 3, for example. TABLE 3 shows the relationship among time, input signal (ROM address), pointer output and shifter output.

TABLE 3

| Time | Input signal (ROM address) | Pointer output | Shifter output |
|---|---|---|---|
| 0 | 1 | 0 | .....1 |
| 1 | 3 | 1 | ..111. |
| 2 | 1 | 4 | .1.... |
| 3 | 1 | 5 | 1..... |
| 4 | 6 | 0 | 111111 |
| 5 | 4 | 0 | ..1111 |
| 6 | 2 | 4 | 11.... |
| 7 | 2 | 0 | ....11 |
| 8 | 6 | 2 | 111111 |
| 9 | 5 | 2 | 1111.1 |
| 10 | 0 | 1 | ...... |
| 11 | 3 | 1 | ..111. |
| . | . | . | . |
| . | . | . | . |
| . | . | . | . |

As shown in TABLE 3, six 1-bit signals are output from the shifter 62 so that values "1", the number of which is indicated by the value of the input signal, are circulated. This means that the value of the input signal is not related to a specific 1-bit signal among the six 1-bit signals. Furthermore, the usage frequency of each bit is uniform in a sufficiently long period or time. For these reasons, even if variations are present among the output of the 1-bit digital/analog converters 13-1 to 13-6 to which the six 1-bit signals are input respectively, it is possible to reduce the occurrence of noise or the like in the signal frequency band.

However, in the above-mentioned conventional digital/analog conversion apparatus, harmonic distortion may occur in the outputs of the 1-bit digital/analog converters 13-1 to 13-6 of the digital/analog conversion circuit 15 shown in FIG. 6. It is supposed that this occurs because of a cause different from the above-mentioned variations in the outputs of the 1-bit digital/analog converters 13-1 to 13-6. The conditions in this case are shown in FIG. 8.

FIG. 8 shows the output spectrum of the 1-bit digital/analog converter 13-1, obtained by computer simulation, at the time when the input signal is a digital signal equivalent to a sinusoidal wave of −40 dB and 2 kHz. Since only one output among the outputs of the six 1-bit digital/analog converters 13-1 to 13-6 is observed, the amplitude becomes 1/6. Therefore, the level of the signal is about −55 dB. It is found that harmonic distortion has occurred, and its level is high, about −70 dB, as shown in FIG. 8.

The reasons why the harmonic distortion occurs in the outputs of the 1-bit digital/analog converters 13-1 to 13-6 will be described below. It is said that a kind of resonance (oscillation) condition occurs because of the relationship between the values of the input signals and the quantity of the 1-bit digital/analog converters 13-1 to 13-6. Since the inputs of the 1-bit digital/analog converters 13-1 to 13-6 (the outputs of the shifter 62) are equivalent to a primary noise shaper, i.e., a primary $\Delta$–$\epsilon$ modulator, resonance is apt to occur, although no detailed explanation is given. In particular, resonance occurs at a constant frequency.

It is noted that the conventional example solves the problem of analog distortion noise caused by analog output errors among the 1-bit digital/analog converters 13-1 to 13-6. On the other hand, the present invention uses a digital circuit configuration comprising the pointer 60, ROM 61 and shifter 21 to solve the problem of digital harmonic distortion singularly occurring in the case when a digital signal equivalent to a sinusoidal wave having a constant frequency is input, for example. Hence, the cause of the harmonic distortion differs from that of the distortion having been solved by the conventional example.

Since the 1-bit digital/analog converters 13-1 to 13-6 are cyclically used as described above, the output spectrums of the 1-bit digital/analog converters 13-2 to 13-6, other than the 1-bit digital/analog converter 13-1, are similar to that of the 1-bit digital/analog converter 13-1, whereby harmonic distortion occurs. However, the harmonic distortion differs in phase among the 1-bit digital/analog converters 13-1 to 13-6. Therefore, if no variation is present (in an ideal case) among the 1-bit digital/analog converters 13-1 to 13-6, the harmonic distortion occurring in the 1-bit digital/analog converters 13-1 to 13-6 can be canceled by the addition at the analog adder 14, and no harmonic distortion occurs at the output of the analog adder 14.

However, variations are present among the outputs of the actual 1-bit digital/analog converters 13-1 to 13-6 as described above. Therefore, the distortion is not canceled by the analog adder 14, but remains at the output of the analog adder 14.

In other words, the analog distortion caused by the errors in the outputs of the 1-bit digital/analog converters 13-1 to 13-6 occurs because of a fixed cause, and can be suppressed by the conventional technology. However, the harmonic distortion occurring digitally in the 1-bit digital/analog converters 13-1 to 13-6 has a considerably high level, and the cause of the occurrence is not fixed. For these reasons, the harmonic distortion cannot be suppressed by simple circulation operation.

SUMMARY OF THE INVENTION

Accordingly, an object of the present invention is to provide a digital/analog conversion apparatus not causing harmonic distortion at the outputs of 1-bit digital/analog converters and capable of effectively suppressing occurrence of harmonic distortion because of variations among the outputs of the 1-bit digital/analog converters.

To attain this object, the present invention has the following configuration.

A digital/analog conversion apparatus in accordance with a first invention comprises a digital filter for increasing the sampling frequency of an input digital signal by k (k: an integer) times, a noise shaper for carrying out word length limitation by using the output of the digital filter as an input and for changing the frequency characteristic of noise to a predetermined characteristic, a decoder for using the output of the noise shaper as a decoder input and for generating and outputting a row of 1-bit signals wherein value "1" is assigned to 1-bit signals, the number of which corresponds to the value of the decoder input, a row of 1-bit digital/analog converters for converting the outputs of the decoder into analog signals, and an analog adder for integrating the outputs of the row of 1-bit digital/analog converters.

In this case, in the row of 1-bit signals, the 1-bit signal position to which value "1" is assigned is circulated, and a 1-bit signal at a predetermined position in the row of 1-bit signals is designated as an inhibit bit wherein the assignment of value "1" is inhibited so that harmonic distortion included in the outputs of the row of 1-bit digital/analog converters can be reduced.

With this configuration, when the output of the noise shaper is converted into a row of 1-bit signals by the decoder, an inhibit bit for inhibiting the assignment of value "1" is provided so that harmonic distortion included in the outputs of the row of 1-bit digital/analog converters can be reduced, whereby a predetermined fluctuation (a fluctuation based on a predetermined rule) can be provided for the circulation of the 1-bit signal position to which value "1" is assigned. As a result, it is possible to prevent occurrence of harmonic distortion.

In other words, by inserting the inhibit bit in the circulating row of 1-bit signals so that harmonic distortion included in the outputs of the row of 1-bit digital/analog converters can be reduced, it is possible to effectively suppress harmonic distortion occurring at the outputs of the 1-bit digital/analog converters. Therefore, an excellent effect of not causing harmonic distortion at the output of digital/analog conversion apparatus is obtained even if the output levels of the 1-bit digital/analog converters have variations.

A digital/analog conversion apparatus in accordance with a second invention comprises a digital filter for increasing the sampling frequency of an input digital signal by k (k: an integer) times, a noise shaper for carrying out word length limitation by using the output of the digital filter as an input and for changing the frequency characteristic of noise to a predetermined characteristic, a decoder for using the output of the noise shaper as a decoder input and for generating and outputting a row of 1-bit signals wherein value "1" is assigned to 1-bit signals, the number of which corresponds to the value of the decoder input, a row of 1-bit digital/analog converters for converting the outputs of the decoder into analog signals, and an analog adder for integrating the outputs of the row of 1-bit digital/analog converters.

In this case, in the row of 1-bit signals, the 1-bit signal position to which value "1", is assigned is circulated, a 1-bit signal at a predetermined position in the row of 1-bit signals is designated as an inhibit bit wherein the assignment of value "1" is inhibited, and the 1-bit signal position corresponding to the inhibit bit is circulated.

With this configuration, when the output of the noise shaper is converted into a row of 1-bit signals by the decoder, an inhibit bit for inhibiting the assignment of value "1" is provided, whereby a predetermined fluctuation (a fluctuation based on a predetermined rule) can be provided for the circulation of the 1-bit signal position to which value "1" is assigned. As a result, it is possible to prevent occurrence of harmonic distortion. In addition, by circulating the bit to which value "1" is assigned and the inhibit bit in accordance with the decoder input, the assignment frequencies of value "1" for all the bits become identical, and the assignment frequencies of the inhibit bit for all the bits also become identical.

In other words, by cyclically inserting the inhibit bit in the row of circulating 1-bit signals, it is possible to effectively suppress harmonic distortion occurring at the outputs of the 1-bit digital/analog converters. Therefore, an excellent effect of not causing harmonic distortion at the output of digital/analog conversion apparatus is obtained even if the output levels of the 1-bit digital/analog converters have variations.

A digital/analog conversion apparatus in accordance with a third invention comprises a digital filter for increasing the sampling frequency of an input digital signal by k (k: an integer) times, a noise shaper for carrying out word length limitation by using the output of the digital filter as an input and for changing the frequency characteristic of noise to a predetermined characteristic, a decoder for using the output of the noise shaper as a decoder input and for generating and outputting a row of 1-bit signals wherein value "1" is assigned to 1-bit signals, the number of which corresponds to the value of the decoder input, a row of 1-bit digital/analog converters for converting the outputs of the decoder into analog signals, and an analog adder for integrating the outputs of the row of 1-bit digital/analog converters.

In this case, in the row of 1-bit signals, the 1-bit signal position to which value "1" is assigned is circulated, a 1-bit signal at a predetermined position in the row of 1-bit signals is designated as an inhibit bit wherein the assignment of value "1" is inhibited, and the 1-bit signal position corresponding to the inhibit bit is circulated so that harmonic distortion included in the outputs of the row of 1-bit digital/analog converters can be reduced.

With this configuration, when the output of the noise shaper is converted into a row of 1-bit signals by the decoder, an inhibit bit for inhibiting the assignment of value "1" is provided so that harmonic distortion included in the outputs of the row of 1-bit digital/analog converters can be reduced, whereby a predetermined fluctuation (a fluctuation based on a predetermined rule) can be provided for the circulation of the 1-bit signal position to which value "1" is assigned. As a result, it is possible to prevent occurrence of harmonic distortion. In addition, by circulating the bit to which value "1" is assigned and the inhibit bit in accordance with the decoder input, the assignment frequencies of value "1" for all the bits become identical, and the assignment frequencies of the inhibit bit for all the bits also become identical.

In other words, by cyclically inserting the inhibit bit in the circulating row of 1-bit signals so that harmonic distortion included in the outputs of the row of 1-bit digital/analog converters can be reduced, it is possible to effectively suppress harmonic distortion occurring at the outputs of the 1-bit digital/analog converters. Therefore, an excellent effect of not causing harmonic distortion at the output of digital/analog conversion apparatus is obtained even if the output levels of the 1-bit digital/analog converters have variations.

In a digital/analog conversion apparatus in accordance with a fourth invention, the above-mentioned decoder of the digital/analog conversion apparatus in accordance with the above-mentioned second or third invention is configured so that the circulation direction of the position of a 1-bit signal in the row of 1-bit signals, to which value "1" is assigned, is aligned with the circulation direction of the position of a 1-bit signal corresponding to the inhibit bit, for example.

With this configuration, by aligning the circulation direction for assigning value "1" with the circulation direction of the inhibit bit, the fluctuation during the circulation can be set to an optimal condition for suppressing harmonic distortion. In other words, by aligning the circulation direction of value "1" assigned to the row of 1-bit signals with the circulation direction of the inhibit bit, harmonic distortion can be prevented more effectively.

In a digital/analog conversion apparatus in accordance with a fifth invention, the above-mentioned decoder of the digital/analog conversion apparatus in accordance with the above-mentioned second or third invention is configured so that when the decoder input has p values (p: an integer not less than 2) for example, a row of 1-bit signals comprising (p–1) 1-bit signals is output; the decoder is also configured so that value "1" is cyclically assigned to each of the 1-bit signals constituting the row of 1-bit signals in order that the position of the 1-bit signal in the row of 1-bit signals, from which the assignment of value "1" starts, becomes the position next to the position of the 1-bit signal to which value "1" is assigned last in the row of 1-bit signals usually at the immediately preceding sample data; and the decoder is further configured so that when the 1-bit signal corresponding to the inhibit bit becomes an object to which value "1" is assigned, by cyclic assignment of value "1" corresponding to a 1-bit signal constituting the row of 1-bit signals, the cyclic assignment of value "1" is continued while avoiding the 1-bit signal corresponding to the inhibit bit, and the position of the inhibit bit is cyclically moved to the next 1-bit signal position.

With this configuration, just as in the case of the digital/analog conversion apparatus in accordance with the second or third invention, a predetermined fluctuation (a fluctuation based on a predetermined rule) can be provided for the circulation of the 1-bit signal position to which value "1" is assigned. As a result, it is possible to prevent occurrence of harmonic distortion. In addition, by circulating the bit to which value "1" is assigned and the inhibit bit in accordance with the decoder input, the assignment frequencies of value "1" at all the bits become identical, and the assignment frequencies of the inhibit bit for all the bits also become identical. In other words, it is possible to effectively suppress harmonic distortion occurring at the outputs of the 1-bit digital/analog converters. Therefore, an excellent effect of not causing harmonic distortion at the output of digital/analog conversion apparatus is obtained even if the output levels of the 1-bit digital/analog converters have variations.

In a digital/analog conversion apparatus in accordance with a sixth invention, the above-mentioned decoder of the digital/analog conversion apparatus in accordance with the fifth invention is configured so that when the maximum (p–1) among p input values in the range of 0 to (p–1) is output for example, the designation of the inhibit bit corresponding to the row of 1-bit signals is temporarily canceled, and value "1" is assigned to all the 1-bit signals of the row of 1-bit signals.

With this configuration, when the input signal has the maximum and it is impossible to designate the inhibit bit, the inhibit bit designation is canceled temporarily, whereby a digital/analog conversion apparatus can be configured by using a minimum of 1-bit digital/analog converters. In other words, when the maximum is input, the inhibit bit assignment is canceled temporarily, and "1" is set to all bits, whereby it is possible to attain a digital/analog conversion apparatus comprising (p–1) 1-bit digital/analog converters least required to output p values.

In a digital/analog conversion apparatus in accordance with a seventh invention, the above-mentioned decoder of the digital/analog conversion apparatus in accordance with the fifth invention is configured so that when the maximum (p–1) among p input values in the range of 0 to (p–1) is output for example, the designation of the inhibit bit corresponding to the row of 1-bit signals is temporarily canceled, and value "1" is assigned to all the 1-bit signals of the row of 1-bit signals, and so that in the row of 1-bit signals, the movement of the 1-bit signal position from which the assignment of value "1" starts and the movement of the 1-bit signal position corresponding to the inhibit bit are stopped.

With this configuration, when the input signal has the maximum and it is impossible to designate the inhibit bit, the inhibit bit designation is canceled temporarily, whereby a digital/analog conversion apparatus can be configured by using a minimum of 1-bit digital/analog converters. Furthermore, the inhibit bit assignment frequency can be made uniform regardless of the bit position. In other words, when the maximum is input, the inhibit bit assignment is canceled temporarily, and "1" is set to all bits, whereby it is possible to attain a digital/analog conversion apparatus comprising (p−1) 1-bit digital/analog converters least required to output p values. In addition to this effect, when the maximum is input, increase in noise can be prevented by stopping the circulation of the inhibit bit position and the value "1" assignment position.

In a digital/analog conversion apparatus in accordance with an eighth invention, the above-mentioned decoder of the digital/analog conversion apparatus in accordance with the fifth invention is configured so that the circulation direction of the position of a 1-bit signal in the row of 1-bit signals, to which value "1" is assigned, is aligned with the circulation direction of the position of a 1-bit signal corresponding to the inhibit bit, for example.

With this configuration, by aligning the circulation direction for assigning value "1" with the circulation direction of the inhibit bit, the fluctuation during the circulation can be set to an optimal condition for suppressing harmonic distortion. In other words, by aligning the circulation direction of value "1" assigned to the row of 1-bit signals with the circulation direction of the inhibit bit, harmonic distortion can be prevented more effectively.

In a digital/analog conversion apparatus in accordance with a ninth invention, the above-mentioned decoder of the digital/analog conversion apparatus in accordance with the eighth invention is configured so that when the maximum (p−1) among p input values in the range of 0 to (p−1) is output for example, the designation of the inhibit bit corresponding to the row of 1-bit signals is temporarily canceled, and value "1" is assigned to all the 1-bit signals of the row of 1-bit signals.

With this configuration, when the input signal has the maximum and it is impossible to designate the inhibit bit, the inhibit bit designation is canceled temporarily, whereby a digital/analog conversion apparatus can be configured by using a minimum of 1-bit digital/analog converters. In other words, when the maximum is input, the inhibit bit assignment is canceled temporarily, and "1" is set to all bits, whereby it is possible to attain a digital/analog conversion apparatus comprising (p−1) 1-bit digital/analog converters least required to output p values.

In a digital/analog conversion apparatus in accordance with a tenth invention, the above-mentioned decoder of the digital/analog conversion apparatus in accordance with the eighth invention is configured so that when the maximum (p−1) among p input values in the range of 0 to (p−1) is output for example, the designation of the inhibit bit corresponding to the row of 1-bit signals is temporarily canceled, and value "1" is assigned to all the 1-bit signals of the row of 1-bit signals, and so that in the row of 1-bit signals, the movement of the 1-bit signal position from which the assignment of value "1" starts and the movement of the 1-bit signal position corresponding to the inhibit bit are stopped.

With this configuration, when the input signal has the maximum and it is impossible to designate the inhibit bit, the inhibit bit designation is canceled temporarily, whereby a digital/analog conversion apparatus can be configured by using a minimum of 1-bit digital/analog converters. Furthermore, the inhibit bit assignment frequency can be made uniform regardless of the bit position. In other words, when the maximum is input, the inhibit bit assignment is canceled temporarily, and "1" is set to all bits, whereby it is possible to attain a digital/analog conversion apparatus comprising (p−1) 1-bit digital/analog converters least required to output p values. In addition to this effect, when the maximum is input, increase in noise can be prevented by stopping the circulation of the inhibit bit position and the value "1" assignment position.

DETAILED DESCRIPTION OF PREFERRED EMBODIMENTS

Figure 1:
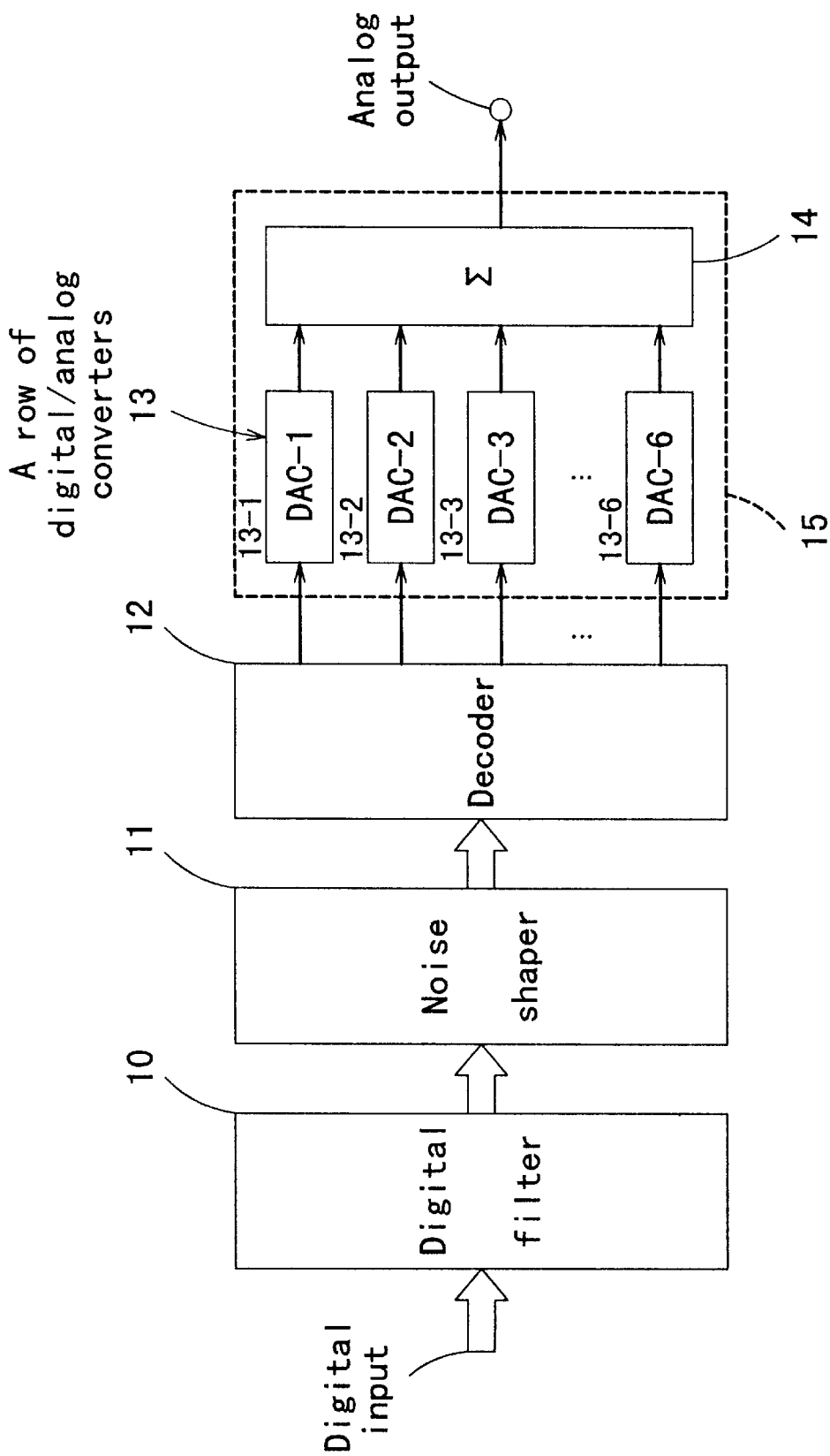
FIG. 1 is a block diagram showing an embodiment of a digital/analog conversion apparatus in accordance with the present invention.

Embodiments of the present invention will be described below referring to the drawings.

FIG. 1 is a block diagram showing an embodiment of a digital/analog conversion apparatus in accordance with the present invention. The digital filter 10 and the noise shaper 11 shown in FIG. 1 have the same configurations and functions as those shown in FIG. 6, respectively.

A decoder 12 is used to output m 1-bit signals in response to a digital signal output from the noise shaper 11. It is herein assumed that m=6.

A row of 1-bit digital/analog converters 13 comprises six 1-bit digital/analog converters 13-1 to 13-6, for example. The row of 1-bit digital/analog converters 13, the analog adder 14 and the digital/analog conversion circuit 15 shown in FIG. 1 have the same configurations and functions as those shown in FIG. 6, respectively.

In the digital/analog conversion apparatus shown in FIG. 1, a digital input signal is changed to a signal having a sampling frequency of 64 fs and seven (=p) levels by the digital filter 10 and the noise shaper 11, then changed to six 1-bit signals by the decoder 12, and further converted into an analog signal by the digital/analog conversion circuit 15. This digital/analog conversion apparatus is the so-called oversampling-type digital/analog conversion apparatus for converting a digital signal into an analog signal by using a sampling frequency higher than the frequency of the digital signal. The number of levels is not limited to seven, but may be eight or more, or six or less as a matter of course.

Figure 2:
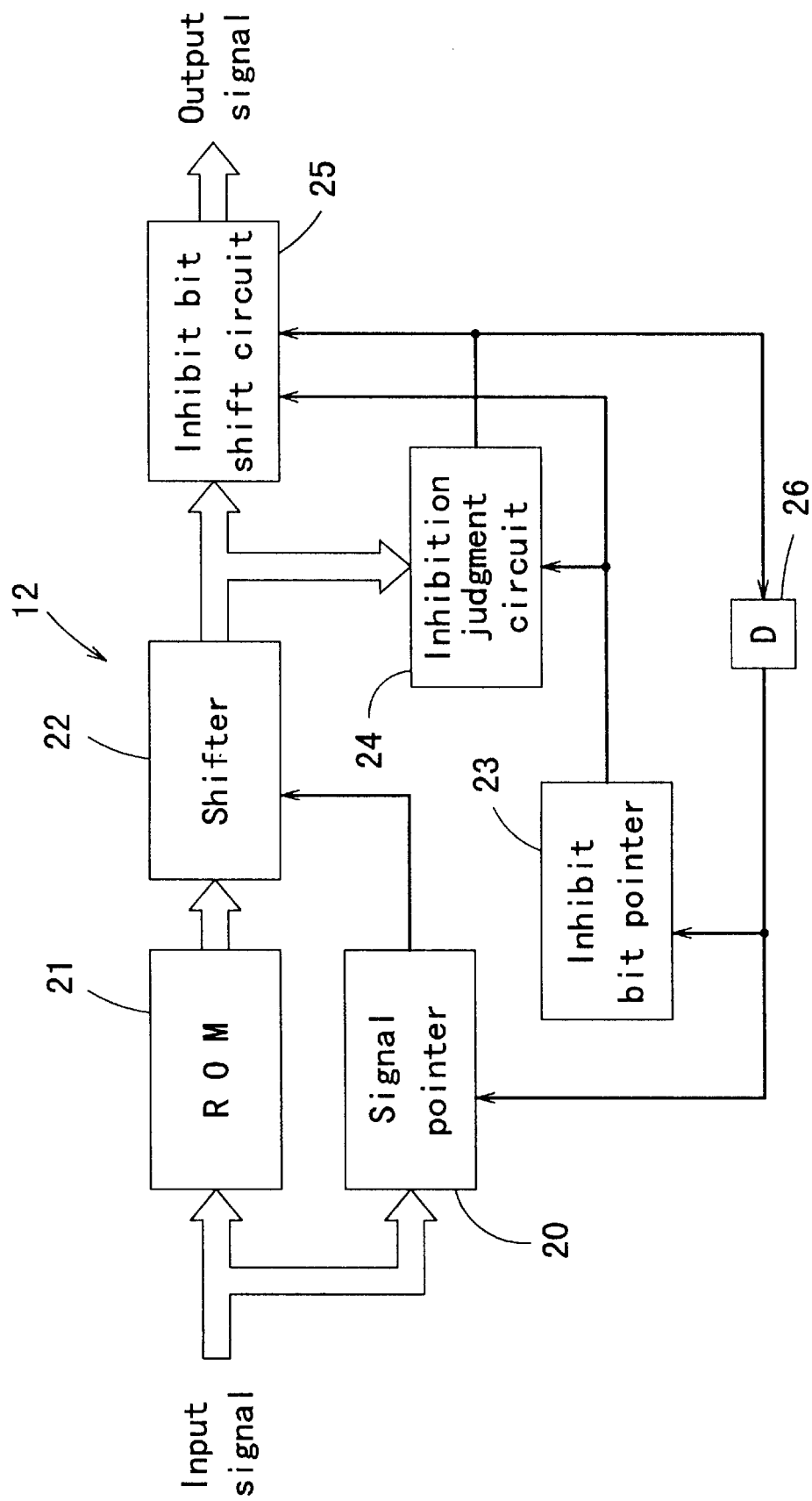
FIG. 2 is a block diagram showing an example of a concrete configuration of a decoder shown in FIG. 1.

FIG. 2 shows an example of a concrete configuration of the decoder 12 shown in FIG. 1. Referring to FIG. 2, a signal pointer 20 indicates the output assignment start position of the input signal, and outputs the remainder of the accumulated value of the input signal. It is herein assumed that the input of the decoder 12 and the output of a delay device 26 described later are accumulated, and the remainder of the accumulated value, with 6 used as the modulus, is output. When it is assumed that the input of the decoder 12 at time t is Xt, and the output of the delay device 26 is Zt, the output Yt is represented by (Equation 3).

$$Yt=(Xt-1+Zt-1+Yt-1) \bmod 6 \quad \text{(Equation 3)}$$

where

Xt−1: the input at the immediately preceding sample

Yt−1: the output at the immediately preceding sample

Zt−1: the output of the delay device 26 at the immediately preceding sample

Figure 6:
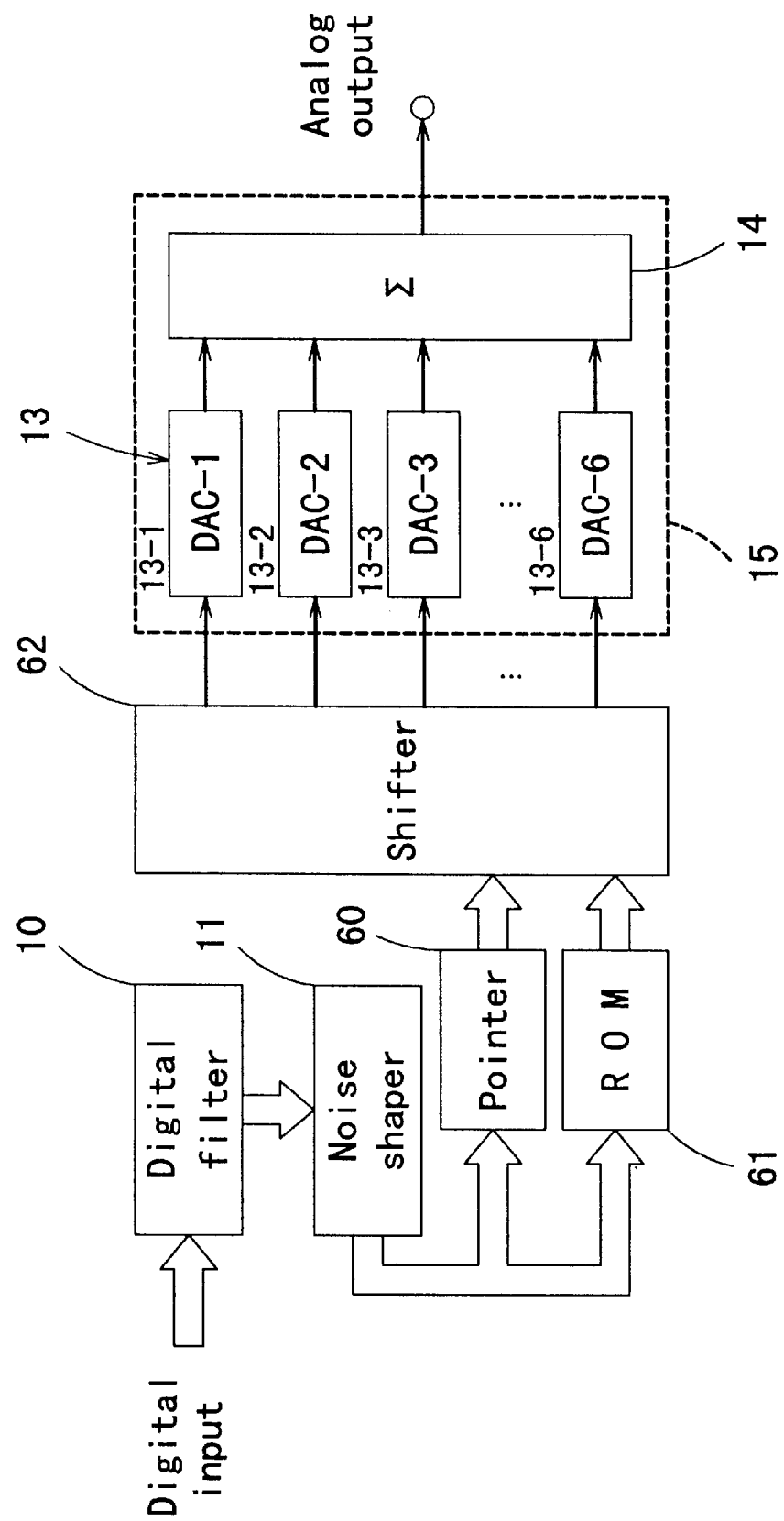
FIG. 6 is a block diagram showing an example of a conventional digital/analog conversion apparatus.
Figure 7:
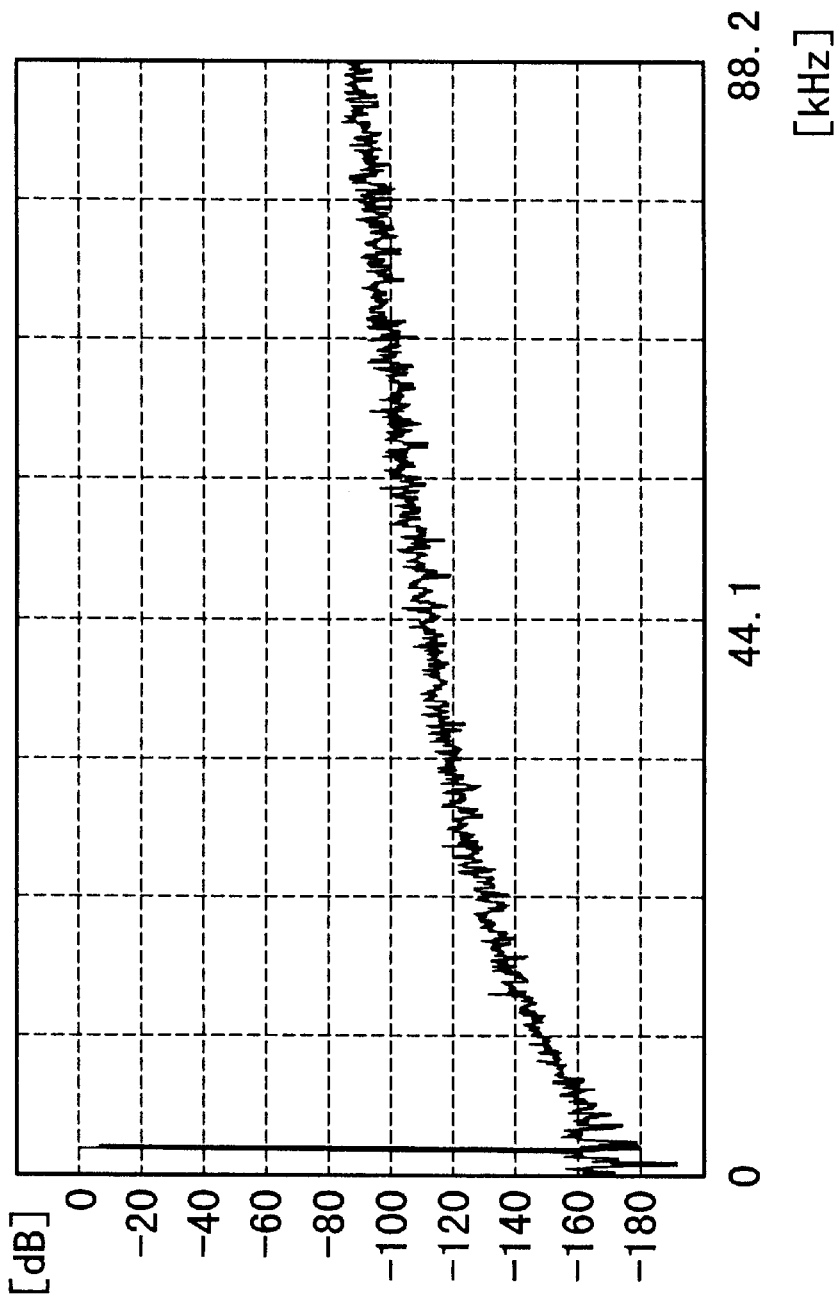
FIG. 7 is a spectrum graph showing an example of an output spectrum of the digital/analog conversion apparatus shown in FIG. 6.

The read-only memory (ROM) 21 and the shifter 22 shown in FIG. 2 have the same configurations and functions as those of the read-only memory 61 and the shifter 62 shown in FIG. 6, respectively. The input and output relationships are the same as those shown in TABLES 1 and 2.

An inhibit bit pointer 23 is used to indicate the position of an inhibit bit. It accumulates (subtracts) the output of the delay device 26, and outputs the remainder of the accumulated value, with 6 used as the modulus. When it is assumed that the output of the delay device 26 at time t is Zt, the output Wt of the inhibit bit pointer 23 is represented by (Equation 4).

$$Wt=(-Zt-1+Wt-1) \bmod 6 \quad \text{(Equation 4)}$$

where

Wt−1: the output at the immediately preceding sample

Zt−1: the output of the delay device 26 at the immediately preceding sample

An inhibition judgment circuit 24 is used to make an inhibition judgment. This circuit outputs "1" when the value at the bit position indicated by the inhibit bit pointer 23 among the bit positions of the output of the shifter 22 is "1", and outputs "0" when the value is "0". An inhibit shift circuit 25 is used to shift the output of the shifter 22 in accordance with the inhibit bit judgment. This circuit sets the inhibit bit to "0" and shifts the output position of value "1" after the inhibit bit in the circulation direction for signal assignment, when the result of the inhibit bit judgment is "1". The delay device 26 is used to delay the output of the inhibition judgment circuit 24 by only one sampling period.

Next, the operation of the decoder 12 shown in FIG. 2 will be described below. First, the signal pointer 20 accumulates the signal having seven levels (0 to 6) output from the noise shaper 11 shown in FIG. 1, and obtains and outputs the remainder of the accumulated value, with 6 used as the modulus. As a result, the output of the signal pointer 20 has six values (0 to 5). Furthermore, the output of the noise shaper 11 is input to the read-only memory 21, and 6-bit data is obtained. This 6-bit data represents six unweighted 1-bit signals. These signals output from the read-only memory 21 are input to the shifter 22, and the 6-bit data is circulated.

Among the bit positions of the output of the shifter 22, the bit position wherein value "1" is assigned by the inhibition judgment circuit 24 is judged by the inhibition judgment circuit 24 whether the bit position is designated as the inhibit bit by the inhibit bit pointer 23. The result of the judgment by the inhibition judgment circuit 24 is then input to the inhibit bit shift circuit 25.

The inhibit bit shift circuit 25 carries out the above-mentioned process in accordance with the result of the judgment by the inhibition judgment circuit 24. In other words, when the output of the inhibition judgment circuit 24 is "1", the bit position designated as the inhibit bit is avoided, and the circulation for signal assignment advances by only one bit. Hence, when the output of the inhibition judgment circuit 24 is "1", "1" is fed back to the signal pointer 20 and the inhibit bit pointer 23 via the delay device 26, and the pointer value of each pointer advances by one bit. When the output of the inhibition judgment circuit 24 is "0", the inhibit bit shift circuit 25 outputs its input as it is.

The output of the circuit shown in FIG. 2, operating as described above, is as shown in TABLE 4, for example. In TABLE 4, data "0" is represented by "." for ease of reading. In addition, the underline "_" in the output of the decoder indicates the inhibit bit position, and "0" indicates that since the shifter output was "1" at the inhibit bit position, this was changed to "0".

TABLE 4

| Time | Input signal (ROM address) | Signal pointer | Shifter output | Inhibit bit pointer | Decoder output |
|---|---|---|---|---|---|
| 0 | 1 | 0 | .....1 | 5 | ._....1 |
| 1 | 3 | 1 | ..111. | 5 | _..111. |
| 2 | 1 | 4 | .1.... | 5 | _.1.... |
| 3 | 1 | 5 | 1..... | 5 | 0_....1 |
| 4 | 6 | 1 | 111111 | 4 | 11_1111 |
| 5 | 4 | 1 | .1111. | 3 | 110_11. |
| 6 | 2 | 0 | ....11 | 2 | ...._11 |
| 7 | 2 | 2 | ..11.. | 2 | .110_.. |
| 8 | 6 | 5 | 111111 | 1 | 11111_1 |
| 9 | 5 | 5 | 1.1111 | 0 | 111110_ |
| 10 | 0 | 5 | ...... | 5 | _..... |
| 11 | 3 | 5 | 1...11 | 5 | 0_..111 |
| . | . | . | . | . | . |
| . | . | . | . | . | . |
| . | . | . | . | . | . |

TABLE 4 will be described below. In the beginning, at time 0 to time 2, since the position of the inhibit bit is "5" (left end), and the output of the shifter 22 is not "1", the output of the decoder 12 is the same as the output of the shifter 22. At time 3, the output of the shifter 22 becomes "1" at the inhibit bit position "5". Therefore, this bit is set to "0", and the next circulation position "0" (right end) becomes "1". Furthermore, as the result of this, at time 4, it is found that the values of the signal pointer 20 and the inhibit bit pointer 23 advance by one bit. In this way, it is configured that the inhibit bit circulates in accordance with the circulation of value "1".

Figure 3:
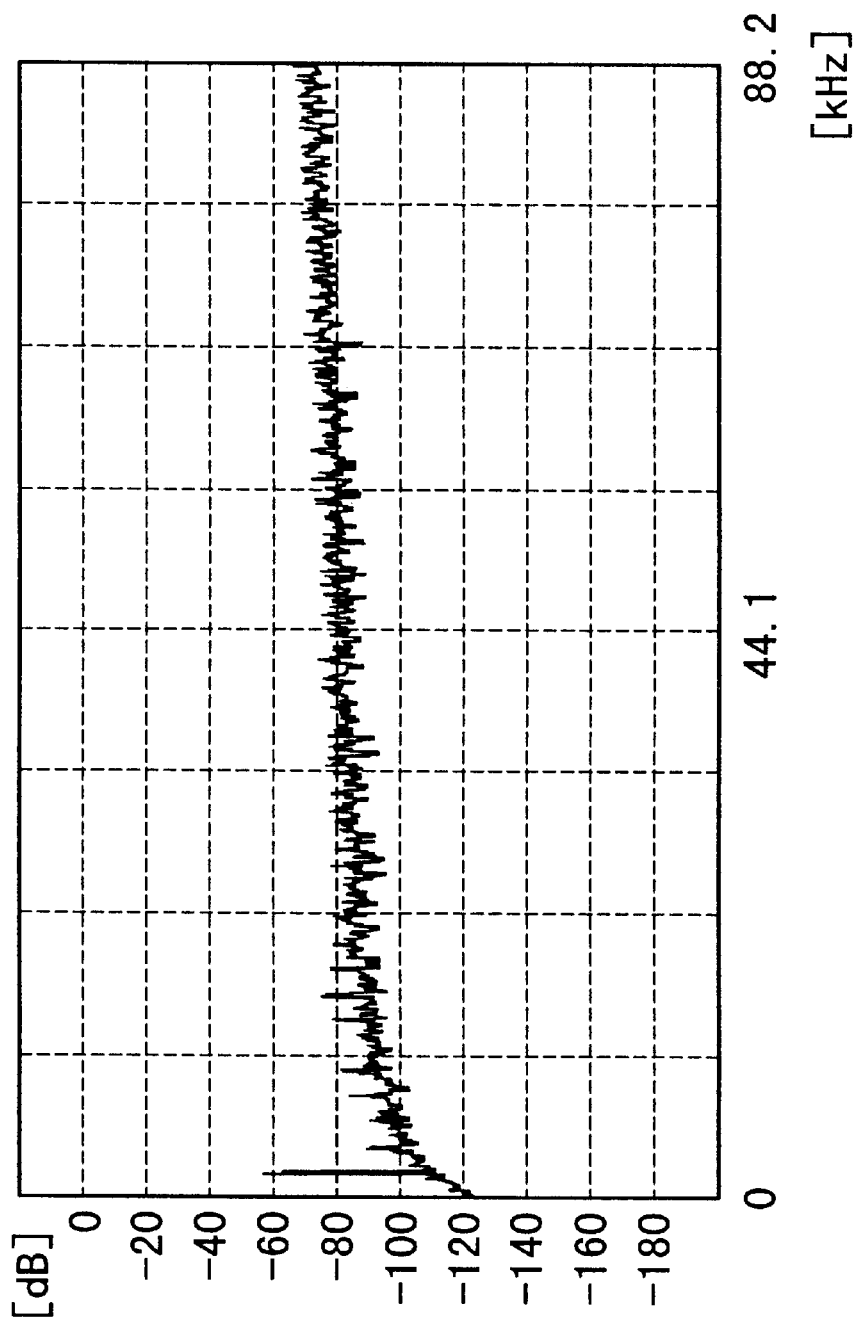
FIG. 3 is a spectrum graph showing an example of an output spectrum of one of 1-bit digital/analog converters in a row of 1-bit digital/analog converters shown in FIG. 1.

When the decoder shown in FIG. 2 is used, the output of the 1-bit digital/analog converter 13-1 shown in FIG. 1 is as shown in FIG. 3. FIG. 3 shows the output spectrum of the 1-bit digital/analog converter 13-1, obtained by computer simulation, at the time when the input signal is a digital signal equivalent to a sinusoidal wave of −40 dB and 2 kHz.

Furthermore, since only the output of the 1-bit digital/analog converter 13-1 among the six 1-bit digital/analog converters 13-1 to 13-6 is observed, the amplitude becomes 1/6 of the output of the analog adder 14. Therefore, the level of the signal is about −55 dB.

Figure 8:
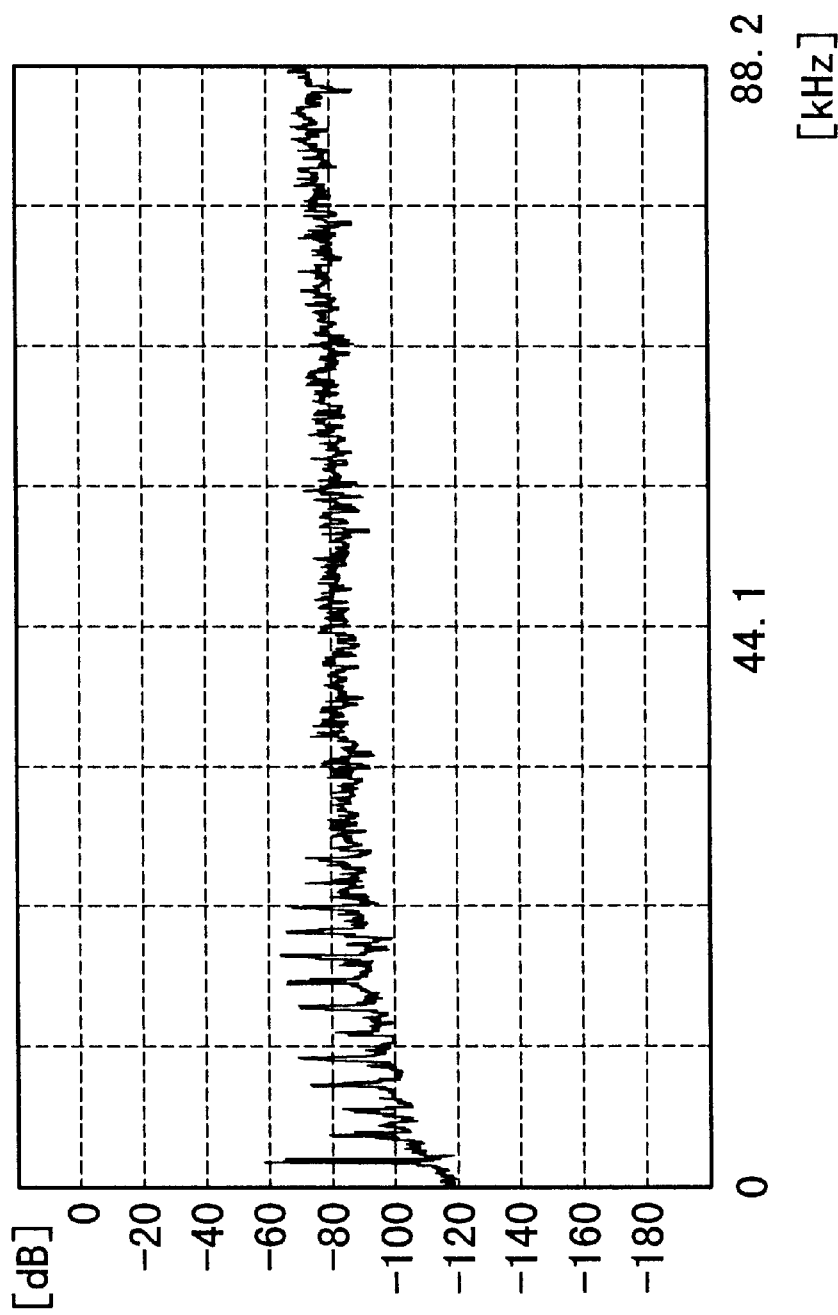
FIG. 8 is a spectrum graph showing an example of an output spectrum of one of 1-bit digital/analog converters 13 shown in FIG. 6.

As shown in FIG. 3, it is found that the harmonic distortion of the 1-bit digital/analog converter 13-1, used as a single unit, is reduced significantly in comparison with that shown in FIG. 8. Therefore, even when harmonic distortion cannot be canceled completely by the analog adder 14 because of variations present in the outputs of the 1-bit digital/analog converters 13-1 to 13-6 as described above, the occurrence of the harmonic distortion at the output of the analog adder 14 can be suppressed significantly.

The reason why the harmonic distortion of each of the 1-bit digital/analog converters 13-1 to 13-6 is suppressed by a fluctuation caused by circulating the inhibit bit will be described below. As described above, the harmonic distortion occurring at the 1-bit digital/analog converters 13-1 to 13-6 is a kind of resonance (oscillation) phenomenon determined by the input signal and the quantity of the 1-bit digital/analog converters. Therefore, by applying a disturbance for randomly disturbing the phenomenon, it is possible to prevent the distortion. This has been confirmed statistically by simulation. The above-mentioned insertion of the inhibit bit corresponds to the application of the disturbance.

Figure 4:
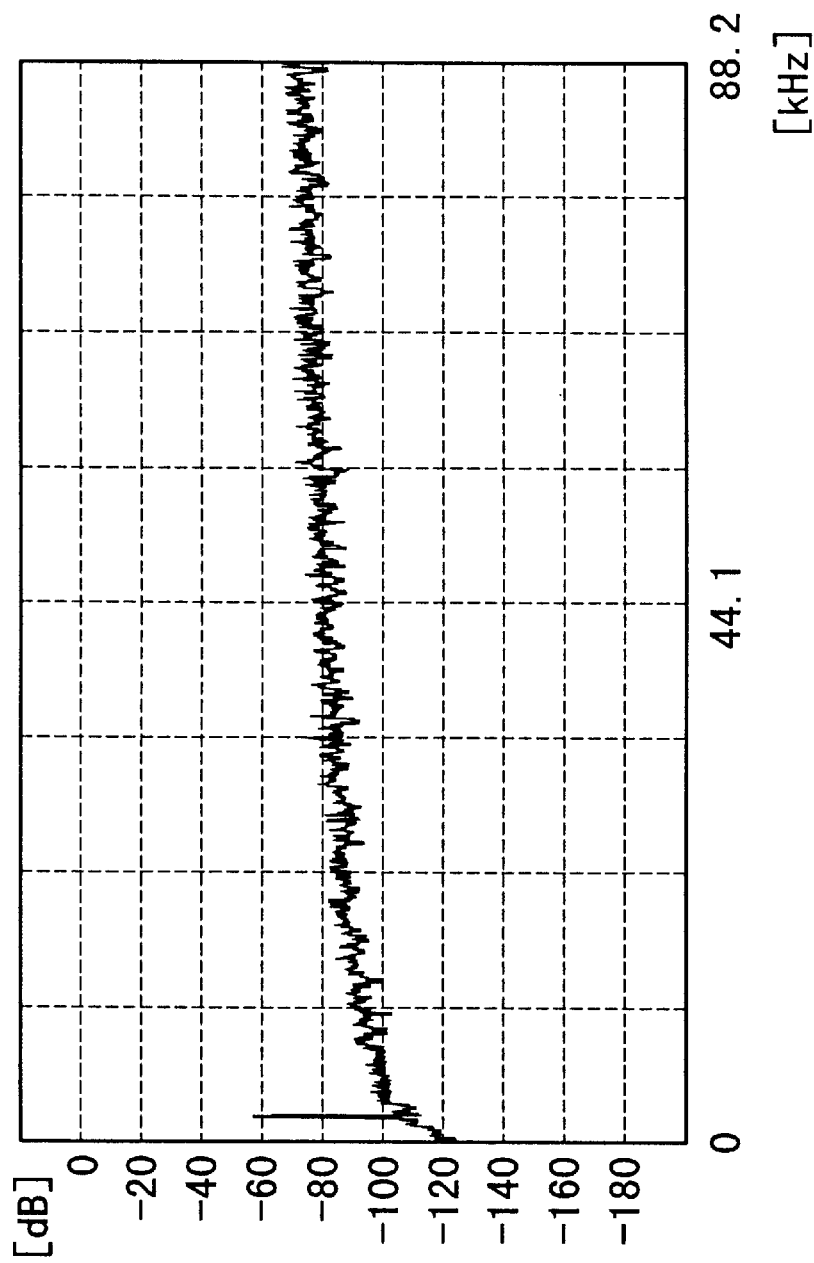
FIG. 4 is a spectrum graph showing another example of an output spectrum of one of 1-bit digital/analog converters in the row of 1-bit digital/analog converters shown in FIG. 1.

In the above-mentioned descriptions, the operation of the inhibit bit pointer 23 is defined by (Equation 4), and the circulation direction of the signal and the circulation direction of the inhibit bit are opposite to each other as clearly shown in TABLE 4. However, the circulation direction of the signal may be identical to the circulation direction of the inhibit bit, for example. When the operation of the inhibit bit pointer 23 is represented by (Equation 5) for example, the output spectrum of the above-mentioned 1-bit digital/analog converter 13-1 is as shown in FIG. 4. It is therefore obvious that the harmonic distortion has been reduced in comparison with that shown in FIG. 3.

$$Wt=(Zt-1+Wt-1) \bmod 6 \qquad \text{(Equation 5)}$$

where

Wt−1: the output at the immediately preceding sample

Zt−1: the output of the delay device 26 at the immediately preceding sample

Herein, the fluctuation frequency for signal circulation will be described below. In this system, the following three effects are obtained on the distortion and noise by the signal circulation.

1) Suppression of output errors in the 1-bit digital/analog converters 13-1 to 13-6 as described in the explanation of the conventional technology 2) Suppression of digital distortion by the insertion of the inhibit bit 3) Suppression of noise by the insertion of the inhibit bit itself Among these, the suppression of distortion and noise at 3) is effectively attained by the circulation of the inhibit bit position for example, because of the essentially same reason as for 1). This circulation should be carried out so that the inhibit bit position is circulated in the forward or backward direction with respect to the circulation direction of the 1-bit signal having value "1". On the other hand, in the case of 2), it may considered that the effect is more significant as the fluctuation is more frequent. However, since the occurrence of harmonic distortion is a kind of resonance (oscillation) phenomenon, it is easily estimated that there is a case wherein by providing a fluctuation in an optimal phase to prevent the resonance, harmonic distortion can be suppressed effectively even when the fluctuation is less frequent. It is considered that this optimal phase is closer to the condition of the circulation in the same direction.

FIG. 4 shows the output spectrum of the 1-bit digital/analog converter 13-1, obtained by computer simulation, at the time when the input signal is a digital signal equivalent to a sinusoidal wave of −40 dB and 2 kHz, in the case when the inhibit bit pointer 23 in accordance with (Equation 5) is used. As shown in FIG. 4, it is found that the harmonic distortion has been reduced further.

The case when the input of the decoder 12 is the maximum 6 will be described below. When the input of the decoder 12 is 6, all the six bits of the output of the read-only memory 21 become "1". Therefore, the output of the inhibition judgment circuit 24 surely becomes "1", and an inhibit bit must be set. However, if the inhibit bit is set to "1", the output value of the decoder 12 becomes 5, and this does not coincide with the input, thereby causing a problem of being unable to set the inhibit bit. To avoid this problem, the setting of the inhibit bit should be canceled temporarily only when the input of the decoder 12 is the maximum 6. In the operation of the inhibit bit shift circuit 25 of the circuit shown in FIG. 2, when its input is 6, this canceling method can be easily attained by not carrying out the inhibit bit process but by setting all the bits of the output to "1" for example.

The condition at this time will be described below referring to TABLE 4. Since the input is 6 at time 4, and all the bits (6 bits) of the output of the shifter 22 are "1", all the bits (6 bits) of the output of the decoder 12 become "1".

In this case, since the inhibit bit pointer 23 keeps operating, the inhibit bit position advances by one bit at time 5 as shown in TABLE 4. If the inhibit bit position advances by one bit when the maximum 6 is input, the frequency of assigning the inhibit bit becomes different depending on the bit position, thereby causing significant deterioration in the characteristic of noise. To prevent this, when the maximum 6 is input, the operation of the inhibit bit pointer 23 should be stopped in order to stop the movement of the inhibit bit position.

Figure 5:
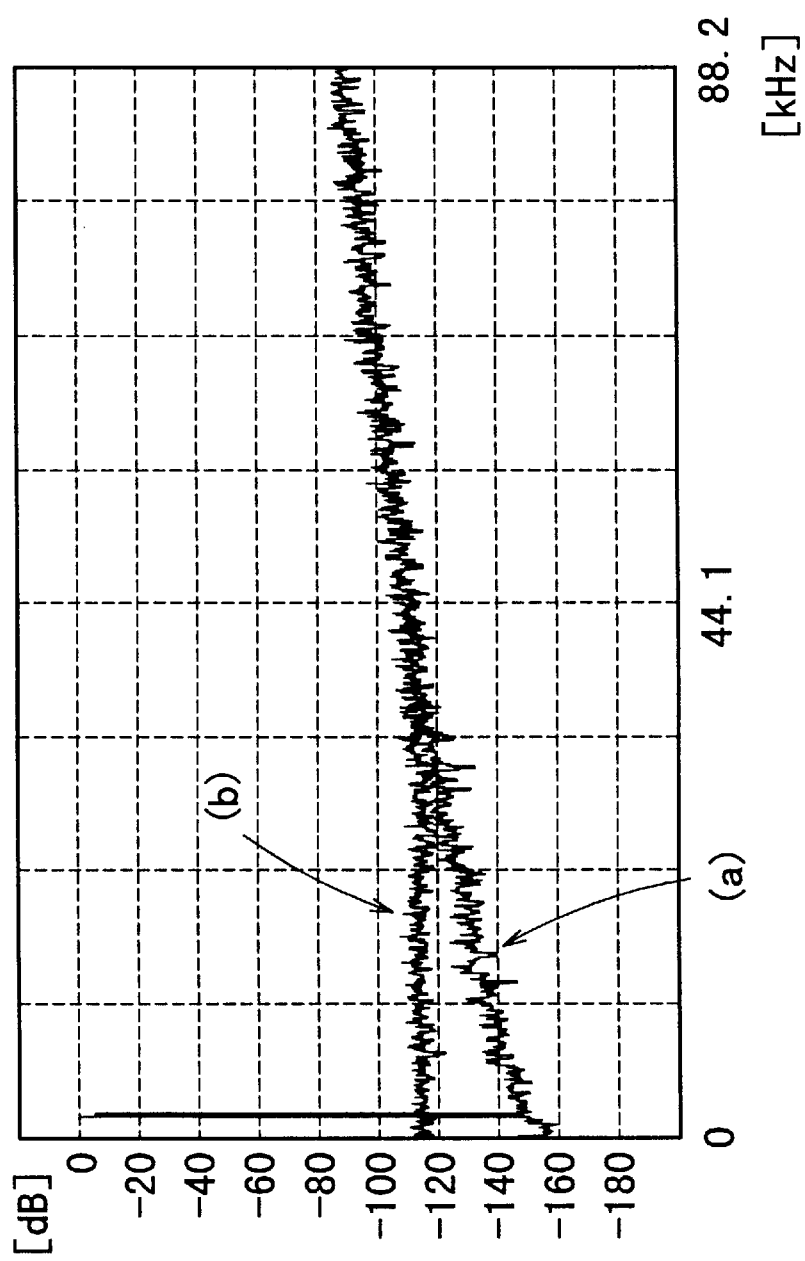
FIG. 5 is a spectrum graph showing examples of output spectrums of the digital/analog conversion apparatus shown in FIG. 1.

FIG. 5 shows the spectrums of the outputs of the digital/analog conversion apparatus comprising the decoder based on this system. Referring to FIG. 5, (a) shows an output spectrum wherein when a value in the range of 1 to 5 is input, the inhibit bit position is moved when a 1-bit signal having value "1" corresponds to the inhibit bit, and when the maximum 6 is input, the movement of the inhibit bit is stopped exceptionally. In addition, (b) shows an output spectrum wherein when a value in the range of 1 to 6 is input, the position of the inhibit bit is moved when a 1-bit signal having value "1" corresponds to the inhibit bit, and the exceptional stop of the inhibit bit movement is not carried out. As clearly shown in FIG. 5, noise can be suppressed effectively by using the above-mentioned system wherein the movement of the inhibit bit is exceptionally stopped when the maximum 6 is input.

The digital/analog conversion apparatus is thus configured as described above. Although the noise shaper 11 operating in accordance with (Equation 1) is used herein, a noise shaper being different in degree, characteristic and the number of output levels may be used as a matter of course, if it functions as a noise shaper. In addition, the configuration of the decoder 12 shown in FIG. 2, the read-only memory data and the like shown in (TABLE 1) are examples only for explanations, and not limited to these, as a matter of course. Furthermore, it is possible to use a logic circuit instead of the read-only memory.

In the above-mentioned embodiment, the inhibit bit is circulated in the opposite direction or in the same direction to suppress digital harmonic distortion. However, in addition to the method of shifting one bit for every sample, a method of shifting two or more bits for every sample, and a method of shifting one or two bits for every plural samples may also be used. Furthermore, it is not particularly necessary to circulate the inhibit bit. In short, the inhibit bit for inhibiting signal assignment should be provided so that the digital harmonic distortion included in the outputs of the row of 1-bit digital/analog converters can be reduced.

What is claimed is:

1. A digital/analog conversion apparatus comprising:

a digital filter for increasing the sampling frequency of an input digital signal by k (k: an integer) times, a noise shaper for carrying out word length limitation by using the output of said digital filter as an input and for changing the frequency characteristic of noise to a predetermined characteristic, a decoder for using the output of said noise shaper as a decoder input and for generating and outputting a row of 1-bit signals wherein "1" is assigned to 1-bit signals, the number of which corresponds to the value of said decoder input, a row of 1-bit digital/analog converters for converting the outputs of said decoder into analog signals, and an analog adder for integrating the outputs of said row of 1-bit digital/analog converters, wherein in said row of 1-bit signals, the 1-bit signal position to which value "1" is assigned is circulated, and a 1-bit signal at a predetermined position in said row of 1-bit signals is designated as an inhibit bit wherein the assignment of value "1" is inhibited so that harmonic distortion included in the outputs of said row of 1-bit digital/analog converters can be reduced.

2. A digital/analog conversion apparatus comprising:

a digital filter for increasing the sampling frequency of an input digital signal by k (k: an integer) times, a noise shaper for carrying out word length limitation by using the output of said digital filter as an input and for changing the frequency characteristic of noise to a predetermined characteristic, a decoder for using the output of said noise shaper as a decoder input and for generating and outputting a row of 1-bit signals wherein "1" is assigned to 1-bit signals, the number of which corresponds to the value of said decoder input, a row of 1-bit digital/analog converters for converting the outputs of said decoder into analog signals, and an analog adder for integrating the outputs of said row of 1-bit digital/analog converters, wherein in said row of 1-bit signals, the 1-bit signal position to which value "1" is assigned is circulated, a 1-bit signal at a predetermined position in said row of 1-bit signals is designated as an inhibit bit wherein the assignment of value "1" is inhibited, and said 1-bit signal position corresponding to said inhibit bit is circulated.

3. A digital/analog conversion apparatus comprising:

a digital filter for increasing the sampling frequency of an input digital signal by k (k: an integer) times, a noise shaper for carrying out word length limitation by using the output of said digital filter as an input and for changing the frequency characteristic of noise to a predetermined characteristic, a decoder for using the output of said noise shaper as a decoder input and for generating and outputting a row of 1-bit signals wherein "1" is assigned to 1-bit signals, the number of which corresponds to the value of said decoder input, a row of 1-bit digital/analog converters for converting the outputs of said decoder into analog signals, and an analog adder for integrating the outputs of said row of 1-bit digital/analog converters, wherein in said row of 1-bit signals, the 1-bit signal position to which value "1" is assigned is circulated, a 1-bit signal at a predetermined position in said row of 1-bit signals is designated as an inhibit bit wherein the assignment of value "1" is inhibited, and said 1-bit signal position corresponding to said inhibit bit is circulated so that harmonic distortion included in the outputs of said row of 1-bit digital/analog converters can be reduced.

4. A digital/analog conversion apparatus in accordance with claim 2, wherein said decoder is configured so that the circulation direction of the position of a 1-bit signal in said row of 1-bit signals, to which value "1" is assigned, is aligned with the circulation direction of the position of a 1-bit signal corresponding to said inhibit bit.

5. A digital/analog conversion apparatus in accordance with claim 2, wherein said decoder is configured so that when said decoder input has p values (p: an integer), a row of 1-bit signals comprising (p−1) 1-bit signals is output; said decoder is also configured so that value "1" is cyclically assigned to each of said 1-bit signals constituting said row of 1-bit signals in order that the position of said 1-bit signal in said row of 1-bit signals, from which the assignment of value "1" starts, becomes the position next to the position of the 1-bit signal to which value "1" is assigned last in said row of 1-bit signals usually at the immediately preceding sample data; and said decoder is further configured so that when the 1-bit signal corresponding to said inhibit bit becomes an object to which value "1" is assigned, by cyclic assignment of value "1" corresponding to a 1-bit signal constituting said row of 1-bit signals, said cyclic assignment of value "1" is continued while avoiding said 1-bit signal corresponding to said inhibit bit, and the position of said inhibit bit is cyclically moved to the next 1-bit signal position.

6. A digital/analog conversion apparatus in accordance with claim 5, wherein said decoder is configured so that when the maximum (p−1) among p input values in the range of 0 to (p−1) is output, the designation of said inhibit bit corresponding to said row of 1-bit signals is temporarily canceled, and value "1" is assigned to all of said 1-bit signals of said row of 1-bit signals.

7. A digital/analog conversion apparatus in accordance with claim 5, wherein said decoder is configured so that when the maximum (p−1) among p input values in the range of 0 to (p−1) is output, the designation of said inhibit bit corresponding to said row of 1-bit signals is temporarily canceled, and value "1" is assigned to all of said 1-bit signals of said row of 1-bit signals, and so that in said row of 1-bit signals, the movement of the 1-bit signal position from which the assignment of value "1" starts and the movement of the 1-bit signal position corresponding to said inhibit bit are stopped.

8. A digital/analog conversion apparatus in accordance with claim 5, wherein said decoder is configured so that the circulation direction of the position of a 1-bit signal in said row of 1-bit signals, to which value "1" is assigned, is aligned with the circulation direction of the position of a 1-bit signal corresponding to said inhibit bit.

9. A digital/analog conversion apparatus in accordance with claim 8, wherein said decoder is configured so that when the maximum (p−1) among p input values in the range of 0 to (p−1) is output, the designation of said inhibit bit corresponding to said row of 1-bit signals is temporarily canceled, and value "1" is assigned to all of said 1-bit signals of said row of 1-bit signals.

10. A digital/analog conversion apparatus in accordance with claim 8, wherein said decoder is configured so that when the maximum (p−1) among p input values in the range of 0 to (p−1) is output, the designation of said inhibit bit corresponding to said row of 1-bit signals is temporarily canceled, and value "1" is assigned to all the 1-bit signals of the row of 1-bit signals, and so that in said row of 1-bit signals, the movement of the 1-bit signal position from which the assignment of value "1" starts and the movement of the 1-bit signal position corresponding to said inhibit bit are stopped.

11. A digital/analog conversion apparatus in accordance with claim 3, wherein said decoder is configured so that the circulation direction of the position of a 1-bit signal row of 1-bit signals, to which value "1" is assigned, is aligned with the circulation direction of the position of a 1-bit signal corresponding to said inhibit bit.

12. A digital/analog conversion apparatus in accordance with claim 3, wherein said decoder is configured so that when said decoder input has p values (p: an integer), a row of 1-bit signals comprising (p−1) 1-bit signals is output; said decoder is also configured so that value "1" is cyclically assigned to each of said 1-bit signals constituting said row of 1-bit signals in order that the position of said 1-bit signal in said row of 1-bit signals, from which the assignment of value "1" starts, becomes the position next to the position of the 1-bit signal to which value "1" is assigned last in said row of 1-bit signals usually at the immediately preceding sample data; and said decoder is further configured so that when the 1-bit signal corresponding to said inhibit bit becomes an object to which value "1" is assigned, by cyclic assignment of value "1" corresponding to a 1-bit signal constituting said row of 1-bit signals, said cyclic assignment of value "1" is continued while avoiding said 1-bit signal corresponding to said inhibit bit, and the position of said inhibit bit is cyclically moved to the next 1-bit signal position.

13. A digital/analog conversion apparatus in accordance with claim 12, wherein said decoder is configured so that when the maximum (p−1) among p input values in the range of 0 to (p−1) is output, the designation of said inhibit bit corresponding to said row of 1-bit signals is temporarily canceled, and value "1" is assigned to all of said 1-bit signals of said row of 1-bit signals.

14. A digital/analog conversion apparatus in accordance with claim 12, wherein said decoder is configured so that when the maximum (p−1) among p input values in the range of 0 to (p−1) is output, the designation of said inhibit bit corresponding to said row of 1-bit signals is temporarily canceled, and value "1" is assigned to all of said 1-bit signals of said row of 1-bit signals, and so that in said row of 1-bit signals, the movement of the 1-bit signal position from which the assignment of value "1" starts and the movement of the 1-bit signal position corresponding to said inhibit bit are stopped.

15. A digital/analog conversion apparatus in accordance with claim 12, wherein said decoder is configured so that the circulation direction of the position of a 1-bit signal in said row of 1-bit signals, to which value "1" is assigned, is aligned with the circulation direction of the position of a 1-bit signal corresponding to said inhibit bit.

16. A digital/analog conversion apparatus in accordance with claim 15, wherein said decoder is configured so that when the maximum (p−1) among p input values in the range of 0 to (p−1) is output, the designation of said inhibit bit corresponding to said row of 1-bit signals is temporarily canceled, and value "1" is assigned to all of said 1-bit signals of said row of 1-bit signals.

17. A digital/analog conversion apparatus in accordance with claim 15, wherein said decoder is configured so that when the maximum (p−1) among p input values in the range of 0 to (p−1) is output, the designation of said inhibit bit corresponding to said row of 1-bit signals is temporarily canceled, and value "1" is assigned to all the 1-bit signals of the row of 1-bit signals, and so that in said row of 1-bit signals, the movement of the 1-bit signal position from which the assignment of value "1" starts and the movement of the 1-bit signal position corresponding to said inhibit bit are stopped.

* * * * *